United States Patent
Xu

(10) Patent No.: US 9,536,973 B2
(45) Date of Patent: Jan. 3, 2017

(54) METAL-OXIDE-SEMICONDUCTOR FIELD-EFFECT TRANSISTOR WITH METAL-INSULATOR-SEMICONDUCTOR CONTACT STRUCTURE TO REDUCE SCHOTTKY BARRIER

(71) Applicant: Taiwan Semiconductor Manufacturing Company, Ltd., Hsin-Chu (TW)

(72) Inventor: Jeffrey Junhao Xu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/981,489

(22) Filed: Dec. 28, 2015

(65) Prior Publication Data
US 2016/0133714 A1 May 12, 2016

Related U.S. Application Data

(62) Division of application No. 13/902,551, filed on May 24, 2013, now Pat. No. 9,240,480.

(60) Provisional application No. 61/785,018, filed on Mar. 14, 2013.

(51) Int. Cl.
| H01L 29/45 | (2006.01) |
| H01L 21/8234 | (2006.01) |
| H01L 29/417 | (2006.01) |
| H01L 29/78 | (2006.01) |
| H01L 23/485 | (2006.01) |
| H01L 21/768 | (2006.01) |

(52) U.S. Cl.
CPC ......... *H01L 29/45* (2013.01); *H01L 21/76831* (2013.01); *H01L 21/76843* (2013.01); *H01L 21/76855* (2013.01); *H01L 21/823418* (2013.01); *H01L 23/485* (2013.01); *H01L 29/41725* (2013.01); *H01L 29/458* (2013.01); *H01L 29/78* (2013.01); *H01L 29/7833* (2013.01); *H01L 2924/0002* (2013.01)

(58) Field of Classification Search
None
See application file for complete search history.

(56) References Cited

U.S. PATENT DOCUMENTS

| 6,087,235 A * | 7/2000 | Yu ................. H01L 29/0847 257/E21.43 |
| 6,511,905 B1 | 1/2003 | Lee et al. |
| 6,724,088 B1 | 4/2004 | Jammy et al. |
| 6,770,954 B2 | 8/2004 | Lee et al. |

(Continued)

FOREIGN PATENT DOCUMENTS

| CN | 102222687 A | 10/2011 |
| CN | 102239546 A | 11/2011 |
| JP | 2008016798 | 1/2008 |

*Primary Examiner* — Benjamin Sandvik
(74) *Attorney, Agent, or Firm* — Slater Matsil, LLP

(57) ABSTRACT

A method includes depositing a first metal layer on a native $SiO_2$ layer that is disposed on at least one of a source and a drain of a metal-oxide-semiconductor field-effect transistor (MOSFET). A metal oxide layer is formed from the native $SiO_2$ layer and the first metal layer, wherein the remaining first metal layer, the metal oxide layer, and the at least one of the source and the drain form a metal-insulator-semiconductor (MIS) contact.

18 Claims, 3 Drawing Sheets

(56) References Cited

U.S. PATENT DOCUMENTS

| | | |
|---|---|---|
| 8,110,877 B2 | 2/2012 | Mukherjee et al. |
| 8,823,065 B2 | 9/2014 | Wang et al. |
| 2007/0090466 A1* | 4/2007 | Park .................. H01L 21/28525 257/382 |
| 2008/0029822 A1 | 2/2008 | Tsuchiya et al. |
| 2009/0026618 A1* | 1/2009 | Kim .................. H01L 21/76843 257/751 |
| 2009/0280641 A1 | 11/2009 | Kang et al. |
| 2010/0123198 A1* | 5/2010 | Kim .................. H01L 21/26506 257/377 |
| 2010/0155846 A1* | 6/2010 | Mukherjee ........ H01L 21/28512 257/365 |
| 2013/0069126 A1 | 3/2013 | Huang et al. |
| 2014/0273366 A1* | 9/2014 | Lin ...................... H01L 27/092 438/200 |

* cited by examiner

METAL-OXIDE-SEMICONDUCTOR FIELD-EFFECT TRANSISTOR WITH METAL-INSULATOR-SEMICONDUCTOR CONTACT STRUCTURE TO REDUCE SCHOTTKY BARRIER

This application is a divisional of U.S. patent application Ser. No. 13/902,551, filed on May 24, 2013, entitled "Metal-Oxide-Semiconductor Field-Effect Transistor with Metal-Insulator-Semiconductor Contact Structure to Reduce Schottky Barrier," and claims priority to U.S. Provisional Application Ser. No. 61/785,018, filed on Mar. 14, 2013, entitled "Method and Apparatus for a Metal-Insulator-Semiconductor Structure," which application is incorporated herein by reference.

TECHNICAL FIELD

The present disclosure relates generally to an integrated circuit and more particularly to a metal-oxide-semiconductor field-effect transistor (MOSFET) with a metal-insulator semiconductor (MIS) contact structure.

BACKGROUND

The source/drain contact resistance of a conventional MOSFET using silicide has limited the performance of the MOSFET due to high Schottky barrier height between the silicide and the source/drain. A MIS structure can be an alternative contact scheme to source/drain to replace silicide and further reduce contact resistance. However, formation of the insulator has challenging issues of precision control for various devices across the entire wafer.

BRIEF DESCRIPTION OF THE DRAWINGS

Reference is now made to the following descriptions taken in conjunction with the accompanying drawings, in which.

DETAILED DESCRIPTION

Figure 1:
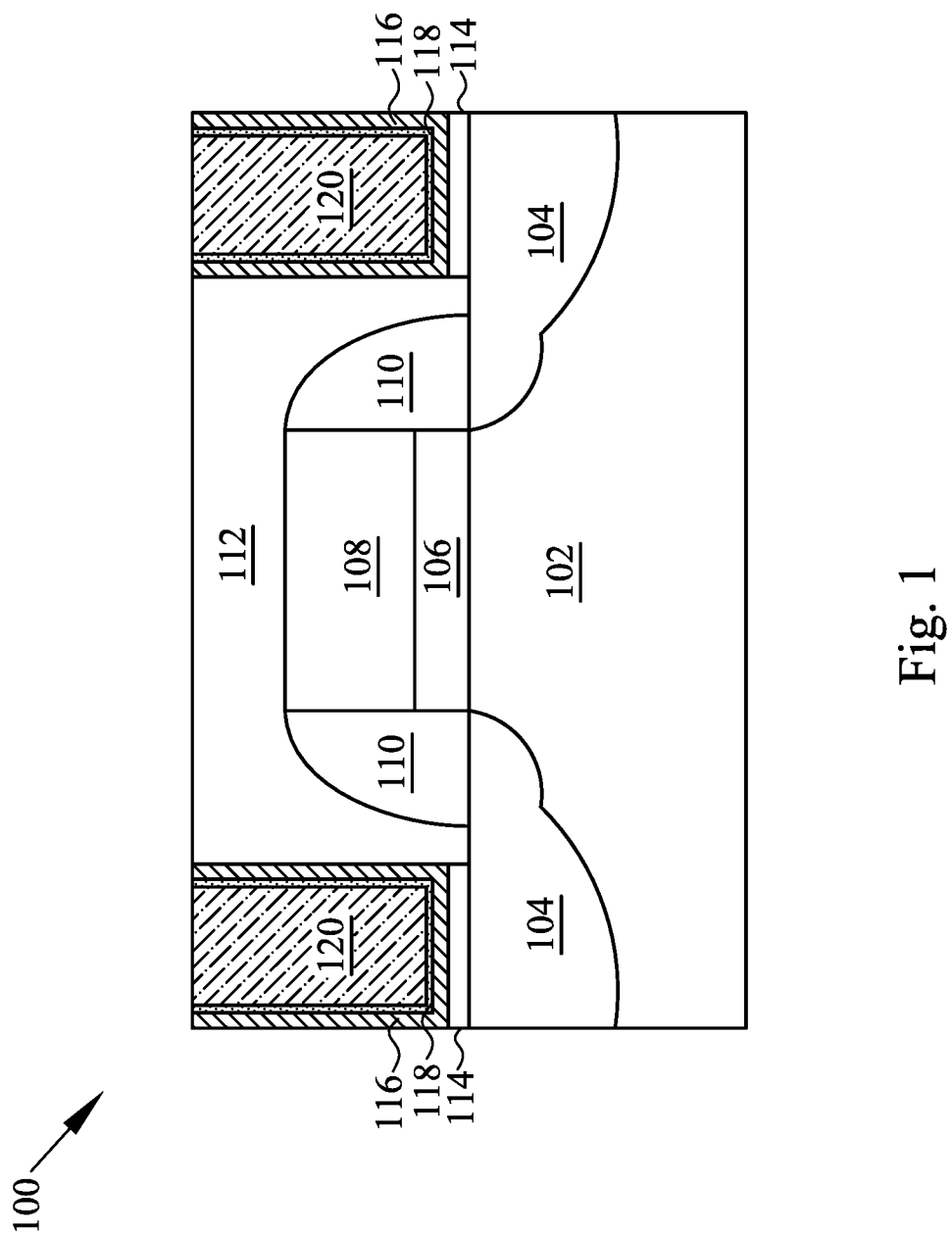
FIG. 1 is a schematic diagram of an exemplary metal-oxide-semiconductor field-effect transistor (MOSFET) with a metal-insulator semiconductor (MIS) contact structure for source/drain according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary metal-oxide-semiconductor field-effect transistor (MOSFET) 100 with a metal-insulator semiconductor (MIS) contact structure for source/drain according to some embodiments. The MOSFET 100 includes a substrate 102, source/drain 104, a gate dielectric layer 106, a gate electrode 108, spacers 110, a dielectric layer 112, a raised silicon layer 114 on the source/drain 104, a metal oxide layer 116, a first metal layer 118, and a second metal layer 120.

The substrate 102 comprises silicon or any other suitable material. The source/drain 104 formed in the substrate 102 is doped with N-type or P-type dopants such as phosphorous or boron. The gate dielectric layer 106 comprises $SiO_2$ or any other suitable dielectric material. The gate electrode comprises polysilicon, metal, or any other suitable material. The spacers 110 comprise $Si_3N_4$, $SiO_2$, or any other suitable material. The dielectric layer 112 comprises $SiO_2$ or any other suitable material.

The first metal layer 118 comprises Ti, Hf, Zr, Al, or any other suitable material that has a stronger affinity to oxygen than the substrate (e.g. silicon) and high-k dielectric properties when oxidized in some embodiments. The metal oxide layer 116 comprises oxidized metal corresponding to the first metal layer 118, such as $TiO_2$, $HfO_2$, $ZrO_2$, $Al_2O_3$, etc. The second metal layer 120 comprises any suitable metal such as Al, Cu, W, etc.

The first metal layer 118 can be deposited by a chemical vapor deposition (CVD) process or a physical vapor deposition (PVD) process. The thickness of the first metal layer 118 ranges from 10 Å to 20 Å in some embodiments. With CVD metal deposition, the sidewall metal thickness is about the same as the bottom. With PVD metal deposition, the sidewall metal thickness will be thinner than the bottom.

The raised silicon layer 114 results from a thermal process of a native $SiO_2$ layer on the surface of the source/drain 104 adjacent the first metal layer 118 in some embodiments. The thermal process forms the metal oxide layer 116 and the raised silicon layer 114 based on metal oxygen scavenge effect as described with respect to FIGS. 2A-2D. Because the native $SiO_2$ layer on the source/drain 104 has generally uniform thickness from 8 Å to 10 Å, the thickness of the resulting metal oxide layer 116 (i.e., insulator in the MIS structure) can be controlled with atomic precision to lower the Schottky barrier height for resistance reduction of the source/drain 104 contact.

In some embodiments, the raised silicon layer 114 on source/drain 104 has a thickness from 3 Å to 5 Å, and the metal oxide layer 116 has a thickness from 8 Å to 10 Å at the bottom and from 10 Å to 15 Å at the side. The thickness control of the insulator layer in the MIS structure (i.e., the metal oxide layer 116 at the bottom) could be achieved within 1 Å to 2 Å, since the self-limiting native $SiO_2$ layer thickness variation range is 1 Å to 2 Å.

A rapid thermal anneal (RTA) process having a peak temperature from 300° C. to 600° C. and a peak time duration from 1 sec to 2 sec can be used in some embodiments. In another example, a rapid thermal anneal (RTA) process with a peak temperature from 700° C. to 1100° C. and a peak time duration in the order of milliseconds can be used.

The metal layers 118 and 120, the metal oxide layer 116, and the source/drain 104 including the raised silicon layer 114 form the MIS contact structure for the source/drain 104 with strong dielectric dipoles to significantly lower the contact resistance through Schottky barrier height reduction. The source/drain contact resistivity of the MIS structure in FIG. 1 is in the order of $10^{-8}$ ohm-cm in some embodiments, compared to the source/drain contact resistivity in the order of $10^{-7}$ ohm-cm for some other structure.

Figure 2A:
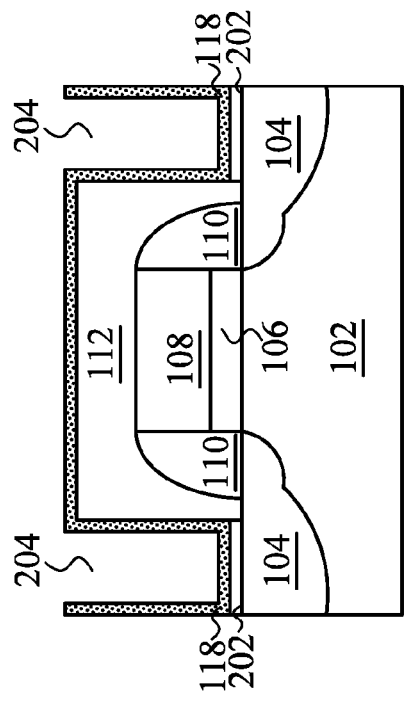
FIGS. 2A-2D are intermediate fabrication steps of the exemplary MOSFET with the MIS contact structure for source/drain in FIG. 1.

FIGS. 2A-2D are intermediate fabrication steps of the exemplary MOSFET 100 with the MIS contact structure for source/drain in FIG. 1. In FIG. 2A, a native $SiO_2$ layer 202 is formed at the bottom of contact holes 204 on the source/drain 104. The native $SiO_2$ layer 202 can be formed naturally under ambient conditions after etching the contact hole 204 and a cleaning process in some embodiments. The contact hole 204 is formed through the dielectric layer 112 disposed over the MOSFET towards the source/drain 104. The thickness of the native $SiO_2$ layer 202 is typically from 8 Å to 10 Å. Since the thickness of the native $SiO_2$ layer 202 is self-limiting on the source/drain 104, it can be uniformly controlled across the entire wafer.

Figure 2B:
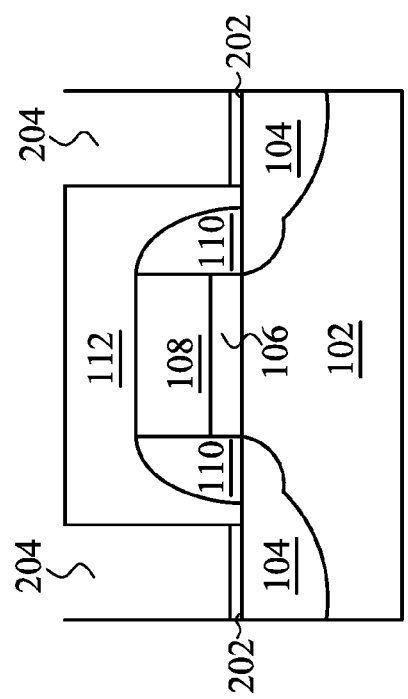

In FIG. 2B, the first metal layer 118 is deposited on the native $SiO_2$ layer 202 and over the source/drain 104 in the contact hole 204 using a chemical vapor deposition (CVD) process or a soft physical vapor deposition (PVD) process such as thermal evaporation without causing any metal and Si physical intermixing in some embodiments. The thickness of the first metal layer 118 ranges from 10 Å to 20 Å in some embodiments. With CVD metal deposition, the sidewall metal thickness is about the same as the bottom. With PVD metal deposition, the sidewall metal thickness will be thinner than the bottom.

The first metal layer 118 comprises Ti, Hf, Zr, Al, or any other suitable material that has a stronger affinity to oxygen than the substrate (e.g. silicon), and high-k dielectric properties when oxidized in some embodiments. For example, the first metal 118 can comprise Ti for NMOS or Al for PMOS for forming favorable dipoles to reduce the Schottky barrier height.

Figure 2C:
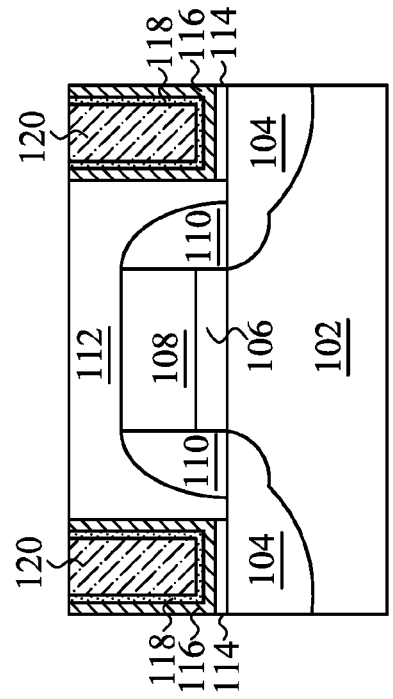

In FIG. 2C, a thermal process (e.g., annealing) is applied in a controlled ambient to trigger metal oxygen scavenge effect and to reduce the native $SiO_2$ layer 202 to the raised silicon layer 114 and form the metal oxide layer 116 such as $TiO_2$, $HfO_2$, $ZrO_2$, $Al_2O_3$, etc. depending on the first metal layer 118. The thermal process also results in the raised silicon layer 114. Part of the first metal layer 118 will react with the native $SiO_2$ layer 202, and the rest remains.

The remaining first metal layer 118, the metal oxide layer 116, and the source/drain 104 (including the raised silicon layer 114) form a MIS structure with strong dielectric dipoles to significantly lower the Schottky barrier height and also reduce the associated contact resistance of the source/drain 104.

In some embodiments, the raised silicon layer 114 on the source/drain 104 has a thickness from 3 Å to 5 Å, and the metal oxide layer 116 has a thickness from 8 Å to 10 Å at the bottom and from 10 Å to 15 Å at the side. The thickness control of the insulator layer in the MIS structure (i.e., the metal oxide layer 116 at the bottom) could be achieved within 1 Å to 2 Å, since the self-limiting native $SiO_2$ layer thickness variation range is 1 Å to 2 Å.

A rapid thermal anneal (RTA) process with a peak temperature from 300° C. to 600° C. and a peak time duration from 1 sec to 2 sec can be used in some embodiments. In another example, a rapid thermal anneal (RTA) process with a peak temperature from 700° C. to 1100° C. and a peak time duration in the order of milliseconds can be used.

Figure 2D:
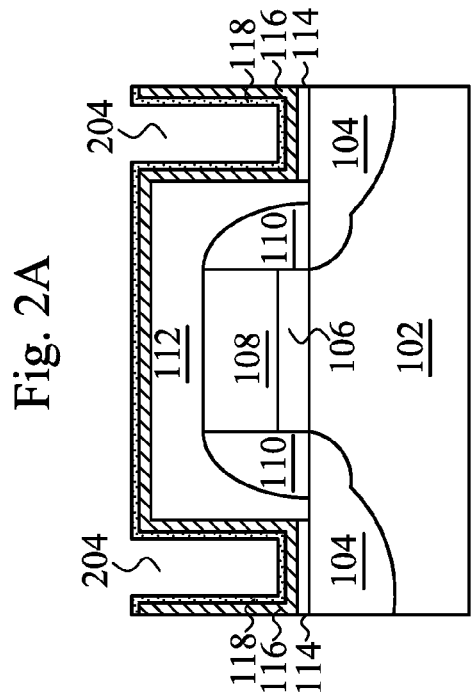

In FIG. 2D, the second metal layer 120 is deposited to fill the contact holes 204 and a chemical mechanical planarization (CMP) is performed to form the MIS contact structure in FIG. 1 that lowers the Schottky barrier height and reduces the contact resistance. The second metal layer 120 comprises Al, Cu, W, or any other suitable metal.

Figure 3:
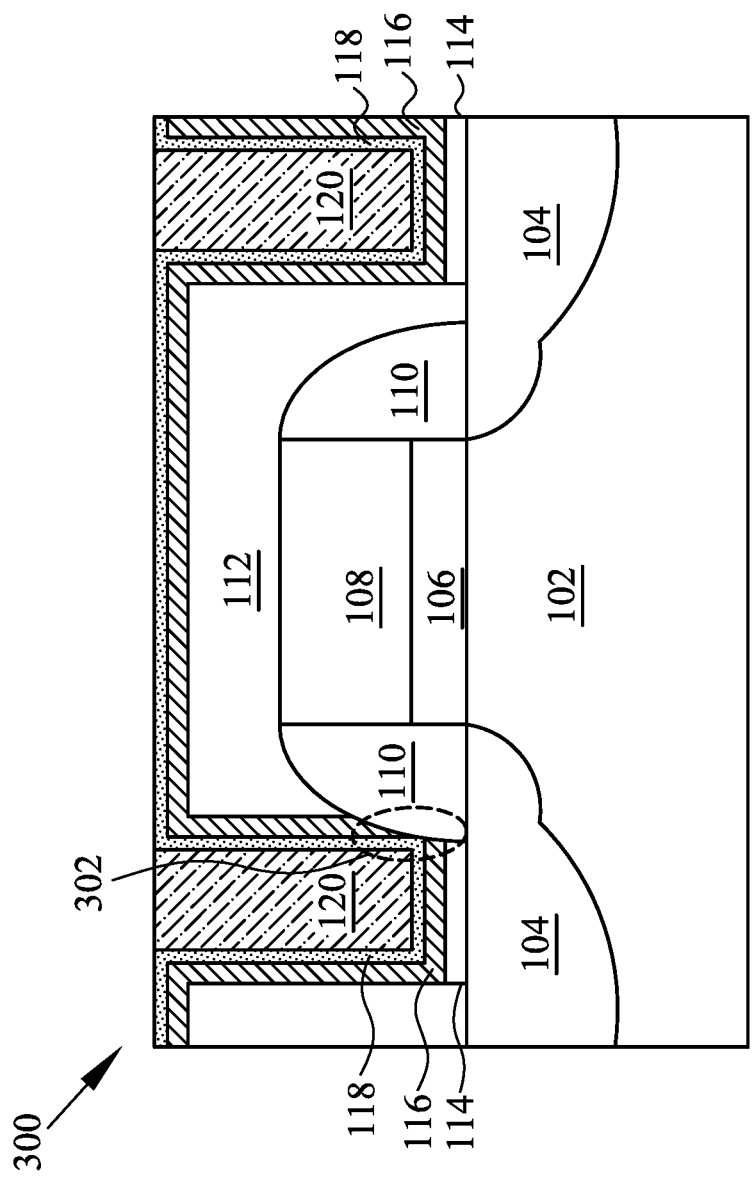
FIG. 3 is a schematic diagram of another exemplary MOSFET with the MIS contact structure for source/drain according to some embodiments.

FIG. 3 is a schematic diagram of another exemplary MOSFET 300 with the MIS contact structure for the source/drain 104 according to some embodiments. The MIS contact structure for source/drain 104 in FIG. 3 is similar to the MIS structure in FIG. 1, except that due to a process alignment error a portion of the first metal layer 118 is deposited adjacent to the spacer 110 (e.g., nitride) around the area 302 with a dotted line.

With the adjacent nitride spacer 110 present, the first metal layer 118 at the area 302 does not form a metal oxide layer. However, since the metal oxide layer 116 is formed on the source/drain 104 at the bottom of the first metal layer 118, the MIS contact structure is still functional to lower the Schottky barrier height and associated contact resistance as described above with respect to FIG. 1.

According to some embodiments, a method includes depositing a first metal layer on a native $SiO_2$ layer that is disposed on at least one of a source and a drain of a metal-oxide-semiconductor field-effect transistor (MOSFET). A metal oxide layer is formed from the native $SiO_2$ layer and the first metal layer, wherein the remaining first metal layer, the metal oxide layer, and the at least one of the source and the drain form a metal-insulator-semiconductor (MIS) contact.

According to some embodiments, a metal-oxide-semiconductor field-effect transistor (MOSFET) includes a substrate, a source on the substrate, a drain on the substrate, a raised silicon layer on at least one of the source and the drain, a metal oxide layer on the raised silicon layer, and a first metal layer on the metal oxide layer. The metal layer, the first metal oxide layer, and at least one of the source and the drain form a metal-insulator-semiconductor (MIS) contact.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A semiconductor device comprising:
   a source on a substrate;
   a drain on the substrate; and
   a contact on at least one of the source and the drain, the contact comprising:
      a raised silicon layer, wherein the raised silicon layer has a thickness ranging from 3 Å to 5 Å;
      a metal oxide layer extending over the top surface of the raised silicon layer from a first side of the raised silicon layer to a second side of the raised silicon layer; and
      a first metal layer on the metal oxide layer.

2. The semiconductor device of claim 1, wherein the first metal layer comprises Ti, Hf, Zr, or Al.

3. The semiconductor device of claim 1, wherein the first metal layer has a thickness ranging from 10 Å to 20 Å.

4. The semiconductor device of claim 1, further comprising a second metal layer on the first metal layer.

5. The semiconductor device of claim 4, wherein the second metal layer comprises Al, Cu, or W.

6. The semiconductor device of claim 1, wherein the metal oxide layer has a thickness ranging from 8 Å to 10 Å.

7. The semiconductor device of claim 1, wherein the metal oxide layer comprises $TiO_2$, $HfO_2$, $ZrO_2$, or $Al_2O_3$.

8. A semiconductor device comprising:
   a gate structure over a substrate, the gate structure comprising a gate electrode, a gate dielectric, and a gate spacer;
   a source/drain region in the substrate;
   a raised silicon layer over the substrate and separated from the gate spacer, wherein the raised silicon layer comprises native silicon;
   a metal oxide layer over the raised silicon layer; and
   a first metal layer over the metal oxide layer.

9. The semiconductor device of claim 8, further comprising a second metal layer over the first metal layer.

10. The semiconductor device of claim 8, wherein the first metal layer, the metal oxide layer, and the raised silicon layer form a metal-insulator-semiconductor (MIS) contact.

11. The semiconductor device of claim 8, further comprising a dielectric layer over the source/drain region, the dielectric layer comprising an opening, wherein the raised silicon layer protrudes into the opening.

12. The semiconductor device of claim 11, wherein the first metal layer is on sidewalls of the opening in the dielectric layer.

13. The semiconductor device of claim 12, wherein a first thickness of the first metal layer on sidewalls of the opening is the same as a second thickness of the first metal layer on the bottom of the opening.

14. A semiconductor device comprising:
   a gate structure on a substrate;
   a source/drain region on the substrate;
   a dielectric layer over the substrate;
   an opening in the dielectric layer over the source/drain region;
   a raised silicon layer disposed within the opening;
   a metal oxide layer disposed over the raised silicon layer within the opening; and
   a first metal layer disposed over the metal oxide layer within the opening, wherein the gate structure comprises a gate electrode and a gate spacer formed on a sidewall thereof and wherein a portion of the first metal layer contacts the gate spacer.

15. The semiconductor device of claim 14, wherein the first metal layer is disposed on sidewalls of the at least one opening.

16. The semiconductor device of claim 14, wherein a second metal layer is disposed over the first metal layer.

17. The semiconductor device of claim 14, wherein the first metal layer, the metal oxide layer, and the raised silicon layer form a metal-insulator-semiconductor (MIS) contact.

18. The semiconductor device of claim 14, wherein a first thickness of the first metal layer on sidewalls of the opening is less than a second thickness of the first metal layer on the bottom of the opening.

* * * * *